United States Patent [19]

Matthies et al.

[11] Patent Number: 4,511,853
[45] Date of Patent: Apr. 16, 1985

[54] DIFFERENTIAL AMPLIFIER CIRCUIT HAVING IMPROVED CONTROL SIGNAL FILTERING

[75] Inventors: Karl H. Matthies, Hamburg; Hartmut Harlos, Norderstedt, both of Fed. Rep. of Germany

[73] Assignee: U.S. Philips Corporation, New York, N.Y.

[21] Appl. No.: 439,142

[22] Filed: Nov. 4, 1982

[30] Foreign Application Priority Data

Apr. 10, 1982 [DE] Fed. Rep. of Germany ....... 3213506

[51] Int. Cl.$^3$ .............................................. H03F 3/45
[52] U.S. Cl. ..................................... 330/259; 330/261
[58] Field of Search ............... 330/252, 254, 259, 261, 330/296

[56] References Cited

FOREIGN PATENT DOCUMENTS 1289596  2/1962  France ................................. 330/252
  61815  5/1981  Japan ................................... 330/254

Primary Examiner—James B. Mullins
Assistant Examiner—G. Wan
Attorney, Agent, or Firm—Robert T. Mayer; Steven R. Biren

[57] ABSTRACT

A circuit arrangement includes a differential amplifier, which supplies a balanced alternating voltage having a d.c. component which is filtered by means of a low-pass filter and is used for negative feedback. In order to avoid the use of a second filter capacitor, the voltages are supplied through a low-pass circuit to a second differential amplifier, which supplies an unbalanced d.c. control signal, which is supplied through a further low-pass filter having only one capacitor to the first differential amplifier.

5 Claims, 1 Drawing Figure

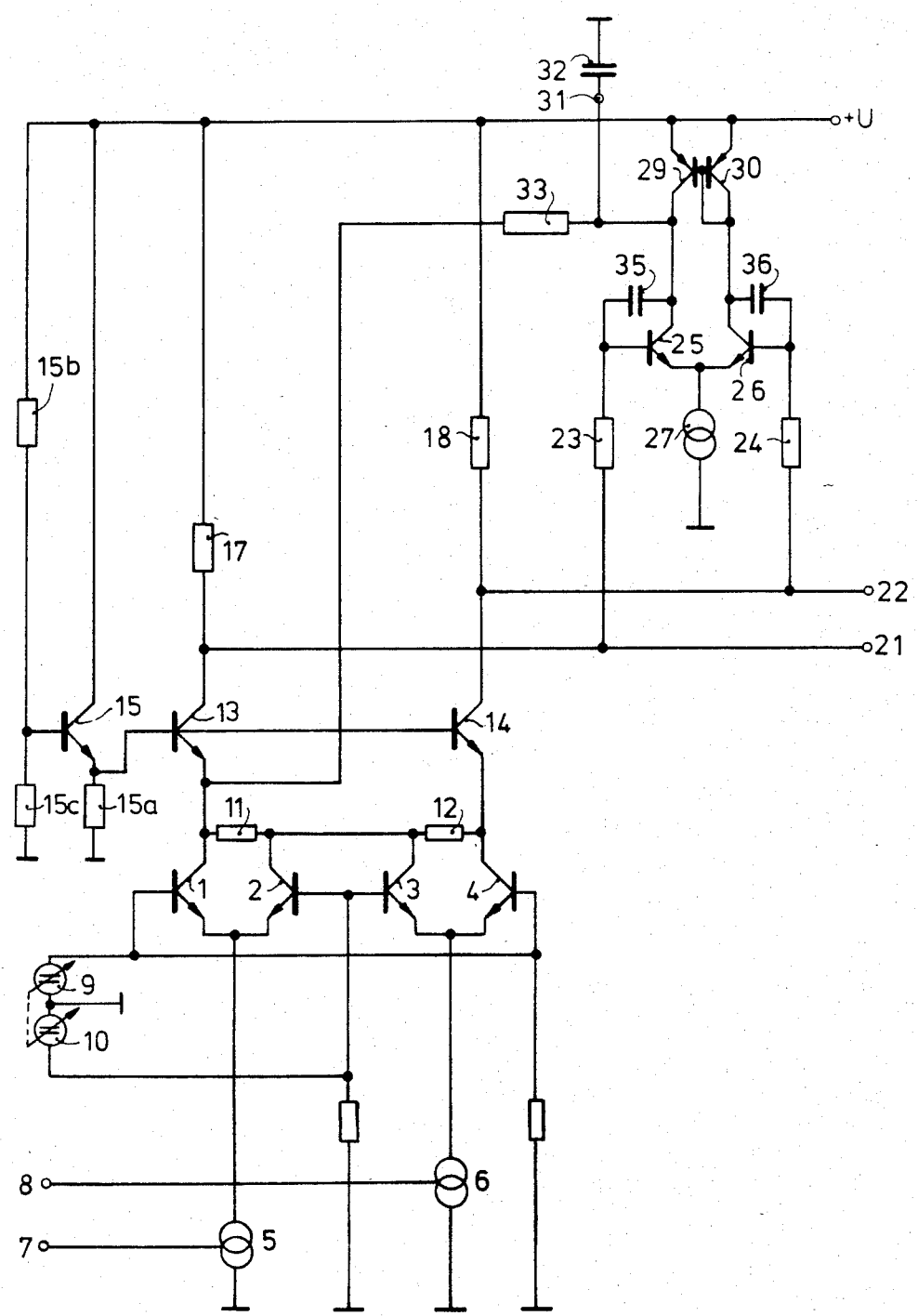

DIFFERENTIAL AMPLIFIER CIRCUIT HAVING IMPROVED CONTROL SIGNAL FILTERING

BACKGROUND OF THE INVENTION

The invention relates to a circuit arrangement, in particular in integrated semiconductor circuits, comprising a first differential amplifier, at the output of which occurs an alternating voltage balanced to ground in the form of two subvoltages with respect to ground, in which circuit arrangement the d.c. component in the balanced alternating voltage is amplified, is freed from the alternating voltage component by means of a low-pass filter and is negatively fed back to at least a branch of the differential amplifier.

Such a circuit arrangement is known from VALVO Berichte, part XVIII, volume 1/2, pages 32 to 37. In this case, the differential direct voltage occurring at the a.c. output is also fed back to the first differential amplifier symmetrically to the control. For filtering this control voltage, two capacitors connected to ground and/or one capacitor between the two control voltage leads are required. Since large capacitances are required, which cannot be included in the remaining part of the circuit arrangement, the two control leads have to be passed to the of the circuit so that two terminals are required. This is undesirable, especially when the circuit arrangement has to be constructed in integrated form.

SUMMARY OF THE INVENTION

The invention has for its object to carry out the filtering for the control quantity, i.e. a control voltage and/or a control current, with the aid of only one large capacitor and thus with the aid of only one terminal extending to the exterior. When the balanced control quantity is combined with an unbalanced control quantity, unilateral interference voltages, for example, from the supply source, can become effective, which do not occur in a circuit arrangement which is balanced to ground. Therefore, additional steps have to be taken to correct this problem.

According to the invention, the above object is achieved in that the subvoltages are supplied through a first and a second low-pass filter, respectively, to a second differential amplifier, which has an unbalanced output and supplies a d.c. control quantity which is supplied through a third low-pass filter to the first differential amplifier.

A pre-filtering step is carried out by means of the first and the second low-pass filters so that the second differential amplifier supplying the unbalanced d.c. control quantity is driven only for a fractional part by the a.c. signal and thus is not overdriven. In the third low-pass filter, the required strong filtering is then effected, in particular with the aid of a single filter capacitor connected to ground.

According to an embodiment of the invention, the first and the second low-pass filters can be constituted by a Miller integrator. With a view to the amplification factor of the amplifier element used therein, only a very small capacitance of, for example, a few pF is required, which can also be realized in integrated semiconductor technique without great difficulty.

The capacitor associated with the third low-pass filter can be directly connected to the unbalanced output of the second differential amplifier. The internal resistance of the differential amplifier, which may be raised to a high value by means of, for example, a current mirror circuit, then constitutes the series impedance of the low-pass filter. The control current filtered by means of the capacitor is effectively supplied to the first differential amplifier through a resistor. By proportioning this resistor, the influence of an unbalanced interference voltage induced by the operating voltage can be reduced.

By the choice of a low-ohmic feeding point for the unbalanced control current, the symmetry of the mains signals is substantially not adversely affected.

BRIEF DESCRIPTION OF THE DRAWING

The invention will now be described more fully with reference to an embodiment as shown in the single FIGURE of the drawing.

DESCRIPTION OF THE PREFERRED EMBODIMENT

A first differential amplifier is constituted by four npn-transistors, the emitters of the transistors 1 and 2, and 3 and 4, respectively, being connected to each other and each through a current source 5 and 6, respectively, which each supply 1.1 mA, to ground. The current of the current sources 5 and 6 is driven in opposite sense by an a.c. signal supplied to the terminals 7 and 8, respectively. The bases of the transistors 1 and 4, and 2 and 3, respectively, are connected to each other and to the terminals of two direct voltage sources 9 and 10. The voltages of the sources 9 and 10 each amount to 4 V with respect to ground; they can be adjusted in opposite sense so that the amplification of the differential amplifier of the first, the second, the third and the fourth transistor 1,2,3,4 can be adjusted thereby. The collectors of the transistors 2 and 3 are connected to each other and through resistors 11 and 12, respectively, of 680 ohms each to the collector of the transistor 1 and 4, respectively. The collectors of the transistors 1 and 4 have connected to them the emitters of a fifth and a sixth transistor 13 and 14, respectively, the bases of which are connected to each other and to a voltage source of 6 V. This voltage source is represented by an npn-transistor 15, which is constructed as an emitter follower in that its emitter, grounded through a resistor 15a, is connected to the base of the transistor 13. The collector of the transistor 15 is connected to the supply source +U and its base is connected to the tapping point of a potentiometer composed of the resistors 15b and 15c, which is connected between supply source U and earth.

The collectors of the transistors 13 and 14, which are connected through load resistors 17 and 18, respectively. of 3 kΩ each to the supply source +U of 12 V, are connected to the output terminals 21 and 22, respectively, from which the a.c. signal amplified in the first differential amplifier 1,2,3,4 can be derived.

The direct voltage value (offset) occurring between the output terminals 21 and 22 is supplied through decoupling and filter resistors 23 and 24, respectively, to the bases of a second differential amplifier constituted by two npn-transistors 25 and 26. The emitters of the transistors 25 and 26 are connected to each other and are ground through a current source 27 of 0.2 mA. The collectors of the transistors 25 and 26 are connected through a current mirror circuit constituted by two pnp-transistors 29 and 30 to the supply source +U, the junction point of the collectors of the transistors 25 and 29 being further connected through a terminal 31 to a capacitor 32 of 22 nF, the other end of which is connected to ground. The control current, smoothed by the capacitor 32, is supplied through a resistor 33 of 5.6 kΩ to the emitter of the transistor 13 and is thus fed into a branch of the balanced amplifier.

When, due to any influences in the a.c. signal at the output 21,22, a d.c. differential voltage occurs, this voltage is supplied to the second differential amplifier 25,26. This amplifier supplies an unbalanced control output signal to the collector of the transistor 25. Due to the presence of the capacitors 35 and 36 of 3 pF each, which are connected between the base and the collector of each of the transistors 25 and 26, these transistors act inside the second differential amplifier as Miller integrators and thus cause a pre-filtering to be effected. The a.c. signal, which between the output terminals 21 and 22 can have a peak-to-peak value of 200 mV, is consequently already pre-filtered so that it amounts at the bases of the transistors 25 and 26 to only approximately 10 mV and therefore an overdrive of the second differential amplifier 25,26 need no longer to be feared. The d.c. signal supplied to the differential amplifier 25,26 occurs at the output as a control signal; there it is very strongly smoothed, the capacitor 32 with the internal resistance on the output side of the second differential amplifier 25,26 acting as a low-pass filter, while finally it is supplied to the first differential amplifier (1,2,3,4) at the emitter of the transistor 13 to readjust the d.c. value. Thus, the desired reduction of the d.c. component in the output signal at the terminals 21 and 22 to a few mV is obtained.

The capacitor 32 has a very low a.c. resistance. Since a useful a.c. signal occurs at the emitter of the transistor 13, a decoupling by the resistor 33 is required to avoid a shortcircuit of the useful signal.

An interference voltage, which may be superimposed on the operating voltage, is divided through the bias voltage divider 15b,15c and is supplied through the emitter follower transistor 15 to the base of the transistor 13. The ratio between the value of the resistor 17 and the value of the resistor 33 determines the effect of the interference signal. This means that the influence of the interference signal can be reduced by the use of a resistor 33 of a maximum resistance value. However, the value of this resistor 33 is limited in that the voltage drive range of the current source 25,29 is limited by the supply voltage +U. In the example shown in the FIGURE, the ratio between the resistors 17 and 33 is about ½ so that the interference voltage at the base of the transistor 13 is attenuated by ½.

The feeding point for the control current, i.e. the emitter of the transistor 13, is of very low resistance and consequently noncritical. Therefore, the symmetry of the useful signals is substantially not disturbed by an unbalanced supply of the differential amplifier 13,14.

In order to improve the amplification of the alternating voltage signal and/or of the transconductance, further amplifier stages can then be operative in a manner known per se.

In the circuit arrangement according to the invention, only one relatively large capacitor 32 is utilized to attenuate fluctuations contained in the balanced signal. The signal symmetry is substantially not adversely affected by the supply of the control current to the low-ohmic emitter of the transistor 13.

What is claimed is:

1. An integrated semiconductor circuit arrangement, which comprises:
    a first differential amplifier having a differential input and a differential output, said output providing an alternating voltage output signal which is balanced with respect to ground and comprises a d.c. component and first and second alternating subvoltages with respect to ground;
    means for filtering the alternating voltage from said d.c. component and amplifying said d.c. component, said means comprising first and second low-pass filters coupled to said first differential amplifier output for filtering said first and second alternating subvoltages, respectively, and a second differential amplifier having first and second inputs coupled to said first and second low-pass filters, respectively, and to said first differential amplifier output, and an unbalanced output at which a d.c. control signal is generated; and
    a third low-pass filter having an input coupled to the unbalanced output of said second differential amplifier and an output which is coupled back to said first differential amplifier to provide negative feedback to said first amplifier.

2. A circuit arrangement as claimed in claim 1, characterized in that the first and the second low-pass filters comprise Miller integrators.

3. A circuit arrangement as claimed in claim 1, characterized in that the subvoltages are obtained at the collectors of two transistors, the emitters of which are connected to the outputs of the first differential amplifier and the bases of which are connected to a fixed direct voltage the control current being supplied by the third low-pass filter to the emitter of a selected one of said transistors.

4. A circuit arrangement as claimed in claim 1, characterized in that the unbalanced output of the second differential amplifier is obtained by a current mirror and in that a capacitor, which comprises the third low-pass filter and is grounded at its other end, is connected to this output.

5. A circuit arrangement as claimed in claim 4, characterized in that an adjusting current for the first differential amplifier is derived from the capacitor through a resistor.

* * * * *